(12) United States Patent
Ho

(10) Patent No.: US 9,762,222 B2
(45) Date of Patent: Sep. 12, 2017

(54) WIRELESS TRANSMISSION APPARATUS, PHASE COMPENSATING APPARATUS AND PHASE COMPENSATING METHOD THEREOF

(71) Applicant: Wistron NeWeb Corp., Hsinchu (TW)

(72) Inventor: Yueh-Lung Ho, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 257 days.

(21) Appl. No.: 14/611,280

(22) Filed: Feb. 2, 2015

(65) Prior Publication Data

US 2016/0226473 A1   Aug. 4, 2016

(51) Int. Cl.
| | |
|---|---|
| G01N 27/72 | (2006.01) |
| H03K 5/15 | (2006.01) |
| H04B 1/04 | (2006.01) |
| H02J 1/00 | (2006.01) |
| H04L 1/00 | (2006.01) |

(52) U.S. Cl.
CPC .............. H03K 5/15 (2013.01); H04B 1/04 (2013.01); H04B 1/0458 (2013.01); *H02J 1/00* (2013.01); *H04B 2001/045* (2013.01); *H04L 1/00* (2013.01); *H04L 2201/00* (2013.01)

(58) Field of Classification Search
CPC .......... H02J 1/00; H04L 1/00; H04L 2201/00; H04L 2221/00
See application file for complete search history.

(56) References Cited

U.S. PATENT DOCUMENTS

| | | | | |
|---|---|---|---|---|
| 2003/0227353 A1* | 12/2003 | Fayyaz | ................... | H03H 11/20 333/161 |
| 2007/0202912 A1* | 8/2007 | Wu | ...................... | H02J 13/0003 455/522 |
| 2009/0243727 A1* | 10/2009 | Bockelman | ............. | H03F 1/086 330/285 |
| 2014/0035384 A1* | 2/2014 | Satyamoorthy | ......... | H01F 38/14 307/104 |
| 2014/0092659 A1* | 4/2014 | Lin | ......................... | H02M 7/06 363/126 |
| 2014/0120852 A1* | 5/2014 | Ashizuka | ............. | H04B 1/0458 455/127.1 |
| 2014/0170996 A1* | 6/2014 | Chung | .................. | H04B 1/0458 455/114.2 |
| 2014/0378188 A1* | 12/2014 | Liu | .................... | H04W 52/0261 455/574 |
| 2015/0142945 A1* | 5/2015 | Brandt | .................. | H04L 47/623 709/223 |

* cited by examiner

*Primary Examiner* — Jermele M Hollington
*Assistant Examiner* — Temilade Rhodes-Vivour
(74) *Attorney, Agent, or Firm* — Jianq Chyun IP Office

(57) ABSTRACT

The invention provides a wireless transmission apparatus, a phase compensating apparatus, and a phase compensating method thereof. The phase compensating apparatus includes main transmission wire, a plurality of capacitors, and at least one phase compensating unit. The main transmission wire is coupled between the output end of the power amplifier and the input end of the impedance matching apparatus. A first end of each of the capacitors is coupled to the main transmission wire. The phase compensating unit has two ends for being coupled to second ends of two of the capacitors.

14 Claims, 5 Drawing Sheets

WIRELESS TRANSMISSION APPARATUS, PHASE COMPENSATING APPARATUS AND PHASE COMPENSATING METHOD THEREOF

BACKGROUND

Field of the Invention

The invention relates to a phase compensating apparatus, and more particularly to the phase compensating apparatus for adjusting phase of a transmission signal of a wireless transmission apparatus.

Description of Related Art

Referring to FIG. 1, FIG. 1 is a plot of frequency response according to an input impedance and an output impedance of a prior art wireless signal transmission apparatus. The prior art wireless signal transmission apparatus has a power amplifier, and an impedance matching apparatus. The curve 110 is a response curve obtained according to an output impedance of the wireless signal transmission apparatus. The curve 120 is a response curve obtained according to the input impedance of the wireless signal transmission apparatus. It can be easily seen, in the prior art, a return loss by coupling the power amplifier 110 to the impedance matching apparatus 120 is between −4 dB to −6 dB. That is, an absolute value of the return loss is too small, and a large voltage standing wave ratio (VSWR) is induced. Such as that, a power transmission efficiency of the wireless signal transmission apparatus 100 is reduced for the large VSWR.

SUMMARY OF THE INVENTION

The invention is directed to a wireless transmission apparatus and a phase compensating apparatus and a phase compensating method thereof, which can effectively reduce a voltage standing wave ratio (VSWR) for signal transmission, and the transmission efficiency can be improved.

The invention provides a phase compensating apparatus which is coupled between an output end of a power amplifier and an input end of an impedance matching apparatus. The phase compensating apparatus includes main transmission wire, a plurality of capacitors, and at least one phase compensating unit. The main transmission wire is coupled between the output end of the power amplifier and the input end of the impedance matching apparatus. A first end of each of the capacitors is coupled to the main transmission wire. The phase compensating unit has two ends for being coupled to second ends of two of the capacitors.

According to an embodiment of present application, wherein the phase compensating apparatus adjusts an output impedance of the power amplifier apparatus to substantially equal to a conjugate complex of an input impedance of a combination circuit of the phase compensating apparatus, impedance matching apparatus, and an antenna, wherein the phase compensating apparatus, impedance matching apparatus, and antenna are coupled in series.

According to an embodiment of present application, wherein the phase compensating apparatus adjusts frequency response curves respectively corresponding to an output impedance of the wireless transmission apparatus and an input impedance of wireless transmission apparatus to be smaller than a pre-set energy during a specified frequency band.

According to an embodiment of present application, wherein when the phase compensating unit is selected, a part of the main transmission wire between the second ends of the two of the capacitors being coupled to the phase compensating unit is cut off.

According to an embodiment of present application, wherein a total effective length of the selected phase compensating unit is less than a wave length of a transmission signal dividing by 2.

According to an embodiment of present application, wherein when the phase compensating unit is unselected, the capacitors being coupled to the phase compensating unit are removed or disconnected, and the unselected phase compensating unit is isolated from the main transmission wire.

According to an embodiment of present application, wherein the main transmission wire and the phase compensating unit are formed by a dielectric material.

According to an embodiment of present application, wherein a shape of the phase compensating unit is rectangular, triangle or curve.

The invention provides a wireless transmission apparatus including a power amplifier, an antenna, an impedance matching apparatus, and a phase compensating apparatus. The power amplifier has an input end for receiving a signal, and an output for generating a transmission signal. The impedance matching apparatus has an output end for being coupled to the antenna. The phase compensating apparatus is coupled between the output end of a power amplifier and an input end of an impedance matching apparatus.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
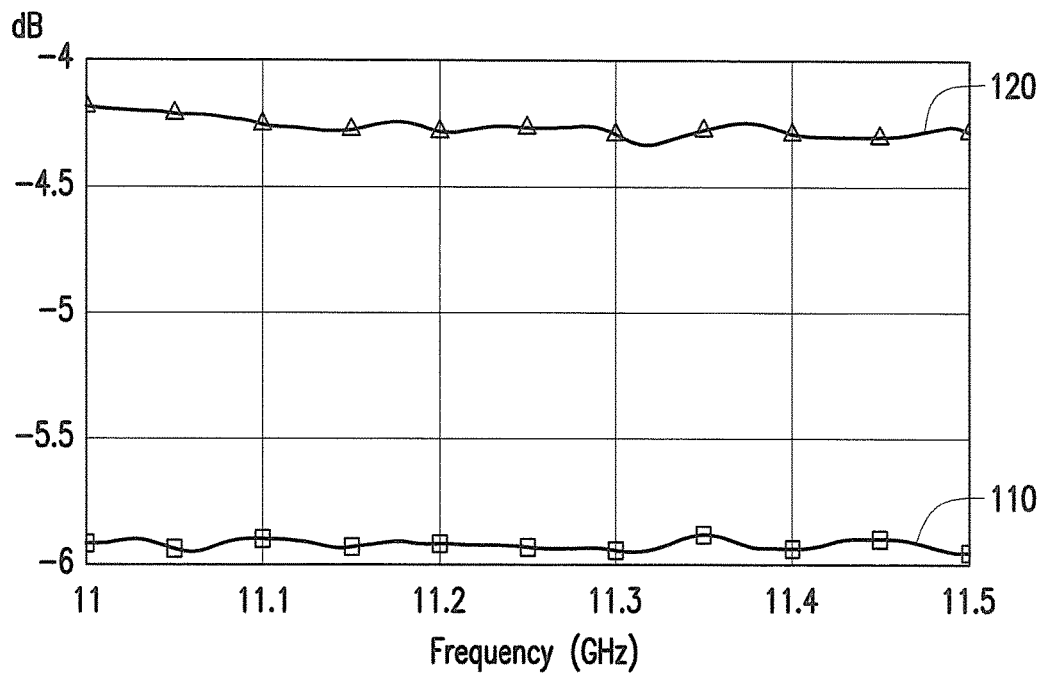
FIG. 1 is a plot of frequency response according to an input impedance and an output impedance of a prior art wireless signal transmission apparatus.
Figure 2:
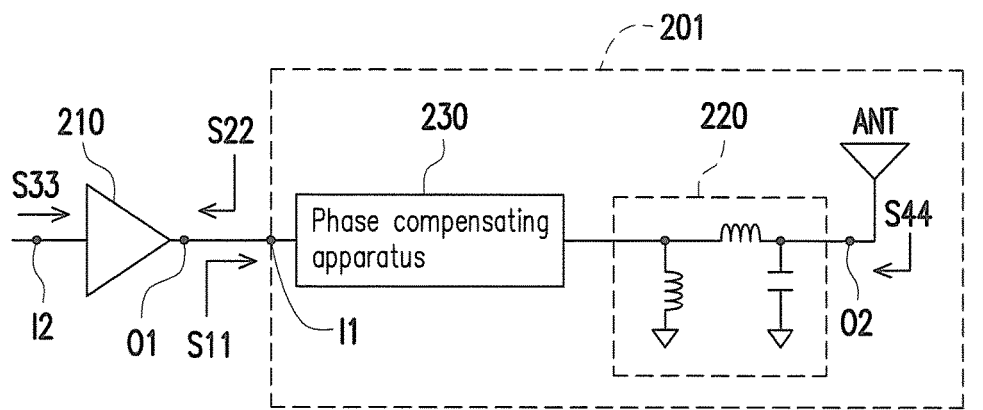
FIG. 2 illustrates a schematic diagram of a wireless transmission apparatus according to an embodiment of present application.

Referring to FIG. 2, FIG. 2 illustrates a schematic diagram of a wireless transmission apparatus according to an embodiment of present application. The wireless transmission apparatus 200 includes a power amplifier 210, an impedance matching apparatus 220, a phase compensating apparatus 230, and an antenna ANT. An output end O1 of the power amplifier 210 is coupled to an input end of the phase compensating apparatus 230, and the input end of the impedance matching apparatus 220 is coupled to an output end of the phase compensating apparatus 230. Besides, an output end of the impedance matching apparatus 320 is coupled to the antenna ANT.

For compensating the impedance mismatch, the phase compensating apparatus 230 is used to compensate an output impedance S22 of the power amplifier 210 and an impedance S11 of a combination circuit 201 of the phase compensating apparatus 230, impedance matching apparatus 220, and antenna ANT. By using the phase compensating apparatus 230, the output impedance S22 of the power amplifier 210 is expected to be substantially equal to a conjugate complex of the input impedance S11 of the combination circuit 201. Wherein, the output impedance S22 of the power amplifier 210 is obtained through the output end O1 of the power amplifier 210, and the input impedance S11 of the impedance matching apparatus 220 is obtained through the input end I1 of the combination circuit 201.

On the other hand, the phase compensating apparatus 230 is used to adjust both of frequency response curves of the input impedance S33 and the output impedance S44 of the wireless transmission apparatus 200 to be lower than a pre-set energy value during a specified frequency band. Wherein, the input impedance S33 is obtained through an input end I2 of the wireless transmission apparatus 200, and the output impedance S44 is obtained through an output end O2 of the wireless transmission apparatus 200. Such as that, the VSWR can be reduced and the transmission efficiency of the wireless transmission apparatus 200 can be improved.

Figure 3:
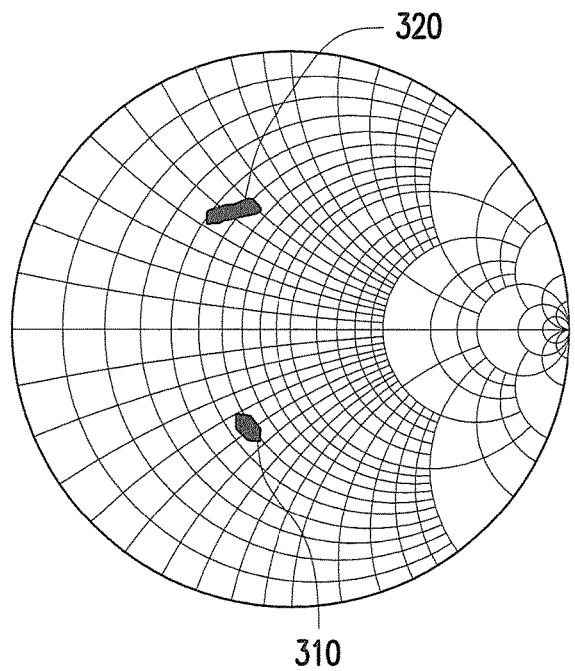
FIG. 3 is a smith chart of the output impedance S22 and the input impedance S11 of the wireless transmission apparatus 300 according to the embodiment in FIG. 2 of present application.

Referring to FIG. 3, FIG. 3 is a smith chart of the output impedance S22 of the power amplifier 210 and the input impedance S11 of the combination circuit 201 according to the embodiment in FIG. 2 of present application. In FIG. 3, a reflection coefficient curve 310 is obtained according to the output impedance S22 of the power amplifier 210 within a specified frequency band, and a reflection coefficient curve 320 is obtained according to the input impedance S11 of the impedance matching apparatus 220 within the specified frequency band. By referring to the reflection coefficient curves 310 and 320, the output impedance S22 is substantially equal to the conjugate complex of the input impedance S11.

Figure 4:
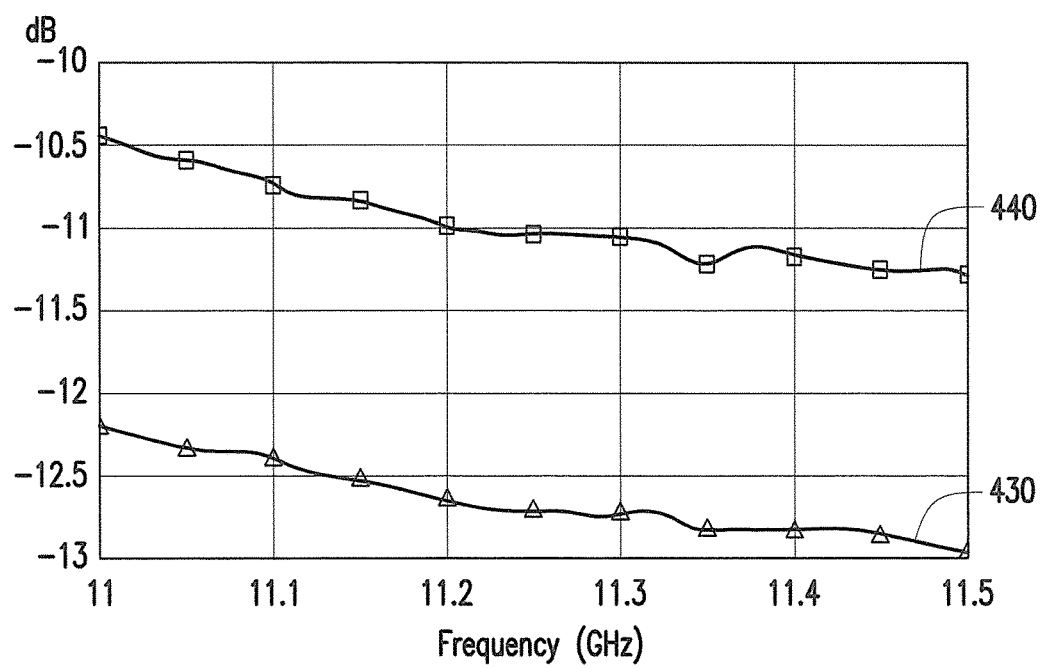
FIG. 4 is a plot of frequency response according to the output impedance S22 and the input impedance S11 of the wireless transmission apparatus 200.

Referring to FIG. 4, FIG. 4 is a plot of frequency response according to the output impedance S44 and the input impedance S33 of the wireless transmission apparatus 200. By adding the phase compensating apparatus 230 between the power amplifier 210 and the impedance matching apparatus 220, the frequency response curves 430 and 440 respectively corresponding to the input impedance S33 and the output impedance S44 are adjusted to be smaller than the pre-set value (−10 dB) during a specified frequency band (11 GHz-11.5 GHz). That is, a return loss of the wireless signal transmission apparatus 200 is reduced.

Figure 5A:
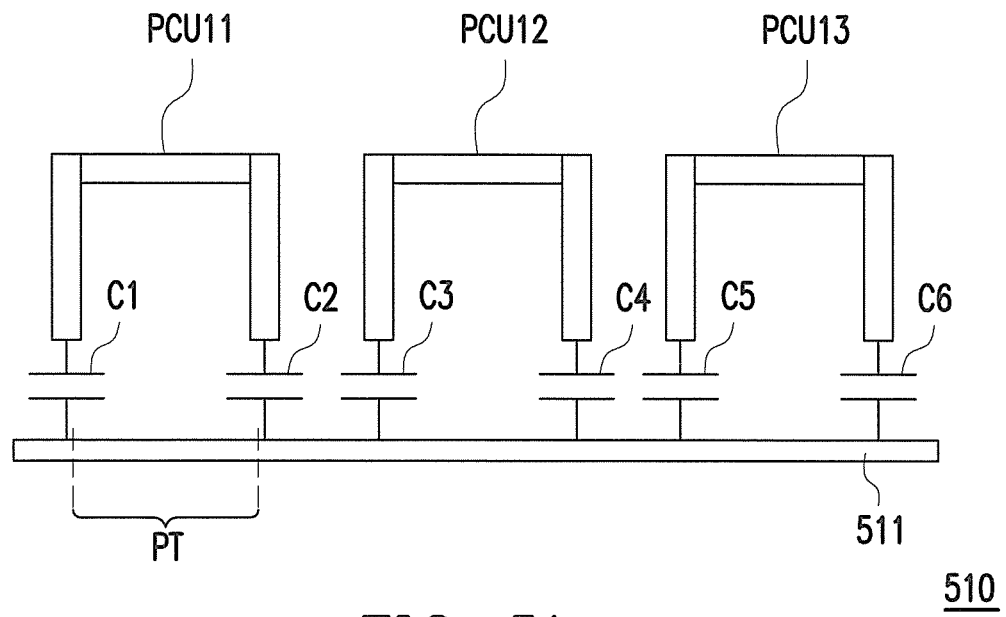
FIG. 5A-FIG. 5C illustrate a plurality of phase compensating apparatus according to embodiments of present application.
Figure 5B:
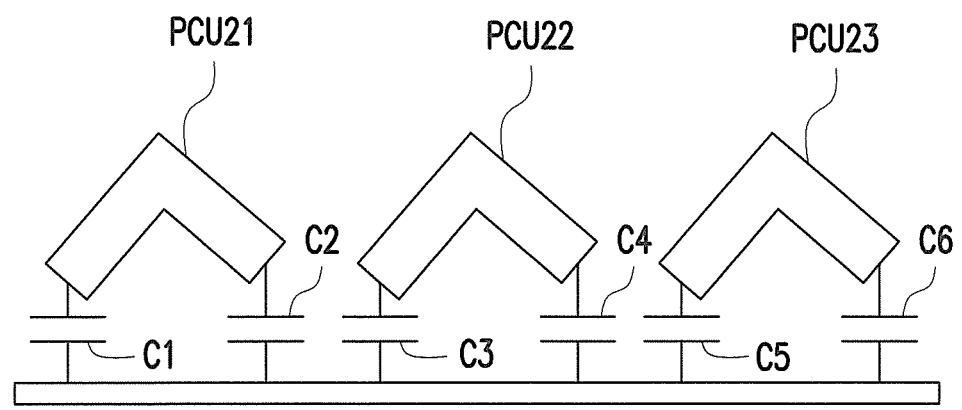
Figure 5C:
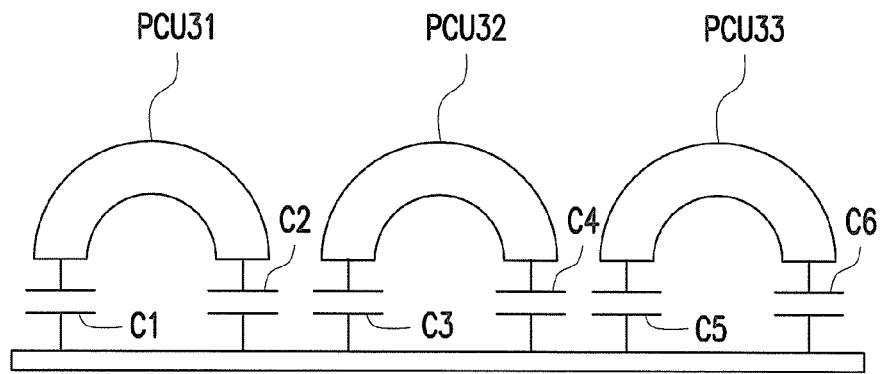

Referring to FIG. 5A-FIG. 5C, FIG. 5A-FIG. 5C illustrate a plurality of phase compensating apparatus according to embodiments of present application. In FIG. 5A, the phase compensating apparatus 510 includes a main transmission wire 511, a plurality of capacitors C1-C6, and a plurality of phase compensating units PCU11-PCU13. The main transmission wire 511 is connected between the output end of the power amplifier and the input end of the impedance matching apparatus in the wireless transmission apparatus. The main transmission wire 511 is used to be a main trace for transmission a transmission signal between the power amplifier and the impedance matching apparatus.

A first end of each of the capacitors C1-C6 is coupled to the main transmission wire 511, and a second end of each of the capacitors C1-C6 is coupled to one of the phase compensating units PCU11-PCU13. Each of the phase compensating units PCU11-PCU13 has two ends for respectively being coupled to second ends of two of the capacitors C1-C6. For example, the first ends of the capacitors C1 and C2 are coupled to the main transmission wire 511, the second end of the capacitor C1 is coupled to one end of the phase compensating units PCU11, and the second end of the capacitor C2 is coupled to another one end of the phase compensating units PCU11.

The phase compensating units PCU11-PCU13, the capacitors C1-C6, and the main transmission wire 511 may be formed by a dielectric material. It should be noted here, a shape of each of the phase compensating units PCU11-PCU13 may be rectangular. Further, each of the phase compensating units PCU11-PCU13 provides an impedance.

The phase compensating apparatus 510 is used to transmit a transmission signal with higher frequency. Such as that, the capacitors C1-C6 may be used to be media for transmitting the transmission signal through the phase compensating units PCU11-PCU13. In detail, for example, if the phase compensating units PCU11 is a selected phase compensating unit, the transmission signal can be transmitted to the phase compensating units PCU11 through the capacitor C1, and the transmission signal can be transmitted from the phase compensating units PCU11 to the main transmission wire 511 through the capacitor C2.

The main transmission wire 511 and the phase compensating units PCU11-PCU13 are formed by a dielectric material. A wavelength of the transmission signal which is transmitted by the phase compensating apparatus 510 can be determined by the dielectric material of the phase compensating units. In detail, the wavelength of the transmission signal is inversely proportion to a dielectric coefficient of the phase compensating units.

It should be noted here, when a phase compensating is operated, at least one of the phase compensating units PCU11-PCU13 is set to be selected, and the selected phase compensating units adjust the output impedance of the power amplifier to be substantially equal to a conjugate complex of the input impedance of a combination circuit of the phase compensating apparatus 510, impedance matching apparatus, and antenna. On another embodiment, the selected phase compensating units adjusts the frequency response curves of the input impedance and output impedance of the wireless transmission apparatus to be smaller than a pre-set energy during a specified frequency band. In an embodiment, for minimizing the transmission length provided by the phase compensating apparatus 510, a total effective length of the selected phase compensating unit is set to less than a wave length of a transmission signal dividing by 2.

For example, if the phase compensating unit PCU11 is selected, the phase compensating units PCU12-PCU13 are unselected. A part PT of the main transmission wire 510 between the second ends of the two of the capacitors C1 and C2 should be cut off. Besides, the capacitors C3-C6 which are coupled to the unselected phase compensating units PCU12-PCU13 should be removed or disconnected.

By setting each of the phase compensating units PCU12-PCU13 to be a selected or un-selected phase compensating unit, the frequency response curve of the input and output impedances of the wireless transmission apparatus can be adjusted to lower than the pre-set energy value during the specified frequency band. The efficiency of the wireless transmission apparatus can be improved. On the other hand, by setting each of the phase compensating units PCU12-PCU13 to be a selected or un-selected phase compensating unit, the input impedance is adjusted to be a conjugate complex of the output impedance.

On the other hand, the shape of the phase compensating units may be varied. Referring to FIG. 5B and FIG. 5C, in the phase compensating apparatus 520, the shape of each of the phase compensating units PCU21-PCU23 is triangular, and in the phase compensating apparatus 530, the shape of each of the phase compensating units PCU31-PCU33 is curve.

Figure 6:
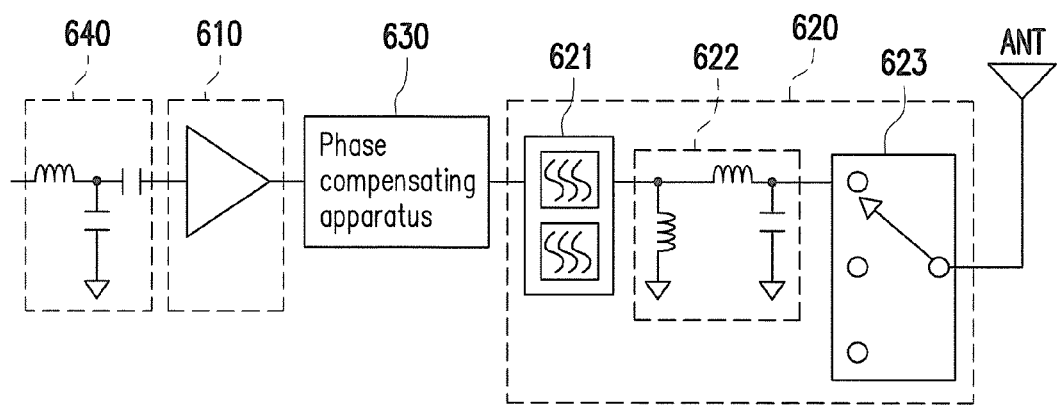
FIG. 6 illustrates a schematic diagram of a wireless transmission apparatus according to another embodiment of present application.

Referring to FIG. 6, FIG. 6 illustrate a schematic diagram of a wireless transmission apparatus according to another embodiment of present application. The wireless transmission apparatus 600 includes an antenna ANT, a power amplifier 610, an impedance matching apparatus 620, a phase compensating apparatus 630, and a filter 640. The filter 640 is coupled to the power amplifier 610 for providing a transmitted signal to the power amplifier 610. The phase compensating apparatus 630 is coupled between the power amplifier 610 and the impedance matching apparatus 620. The phase compensating apparatus 630 is used to compensate an output impedance of the power amplifier 610 and an input impedance of a combination circuit of the phase compensating apparatus 630, impedance matching apparatus 620 and the antenna ANT, and the output impedance of the amplifier is substantially a conjugate complex of the input impedance of the combination circuit. The phase compensating apparatus 630 is also used to compensate an output impedance and input impedance of the wireless transmission apparatus 600, and the frequency response curves respectively corresponding to the output impedance of the wireless transmission apparatus and the input impedance of wireless transmission apparatus are smaller than a pre-set energy during a specified frequency band.

The impedance matching apparatus 620 includes a filter 621, an impedance adjusting circuit 622, and an antenna switch 623. The filter 621 is coupled to an output end of the phase compensating apparatus 630, an output end of the filter 621 is coupled to the impedance adjusting circuit 622, and the antenna switch 623 is coupled between the impedance adjusting circuit 622 and the antenna ANT.

Figure 7:
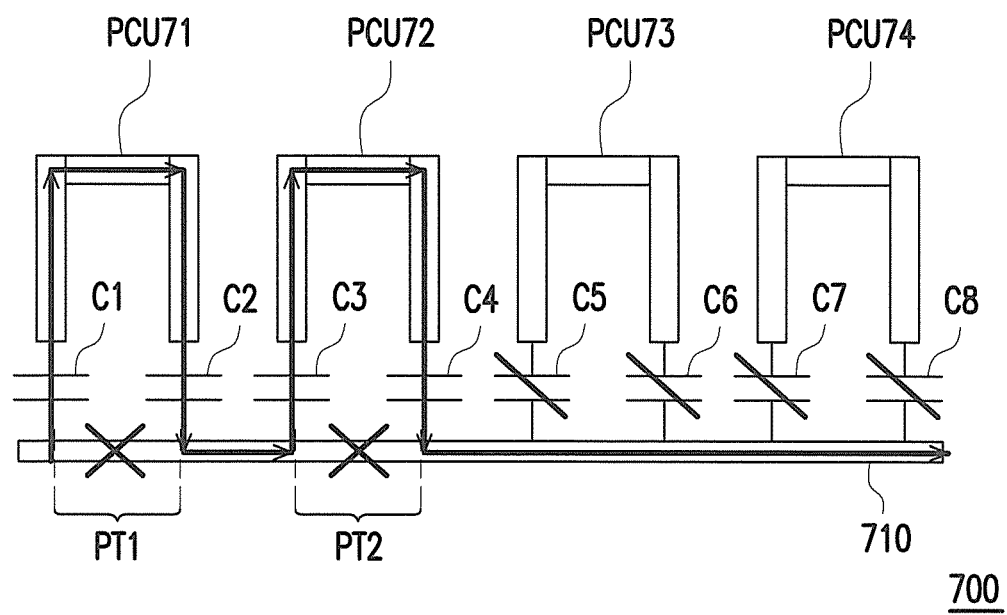
FIG. 7 illustrates a schematic plot for showing a phase compensating operation operated on the phase compensating apparatus 700 according to an embodiment of present application.

Referring to FIG. 7, FIG. 7 illustrates a schematic plot for showing a phase compensating operation operated on the phase compensating apparatus 700 according to an embodiment of present application. The phase compensating apparatus 700 is adapted in a wireless transmission apparatus. In FIG. 7, the phase compensating units PCU71-PCU72 are selected, and the phase compensating units PCU73-PCU74 are unselected for the phase compensating operation. Therefore, the part PT1 of the main transmission wire 710 between the second ends of the two capacitors C1, C2 and the part PT2 between the second ends of the two capacitors C3 and C4 should be cut off. Further, the capacitors C5-C8 are removed or disconnected to the main transmission wire 710.

The transmission signal may be transmitted through a first end of the main transmission wire 710, the capacitor C1, the selected phase compensating unit PCU71, the capacitors C2 and C3, the selected phase compensating unit PCU72, the capacitor C4, and the second end of the main transmission wire 710, and transmitted to an impedance matching apparatus. Besides, in some embodiments, the total length of the selected phase compensating units PCU71 and PCU72 is set to less than a wave length of a transmission signal dividing by 2.

For example, if the frequency of the transmission signal is 11.25 GHz, the dielectric coefficient of the compensating units PCU71-PCU74 and the main transmission wire 710 is 3.33, and the wave length of the transmission signal is 8.2 mm. For adjusting the output impedance of the amplifier and the input impedance of a combination circuit of phase compensating apparatus 700, impedance matching circuit, and antenna, or for adjusting the input impedance and output impedance of the wireless transmission apparatus, the phase compensating units PCU71 and PCU72 may be selected. Wherein, the phase compensating apparatus 700, impedance matching circuit, and antenna are coupled in series. The selected phase compensating units PCU71 and PCU72 provides expanding transmission length which is equal to 1.8 mm for transmitting the transmission signal, and the total length (1.8 mm) of the selected phase compensating units PCU71 and PCU72 is smaller than a half of the wave length (8.2 mm/2=4.1 mm) of the transmission signal.

In summary, the present application provides a phase compensating apparatus coupled between the power amplifier and the impedance matching apparatus, and the phase compensating apparatus provides more impedance on the transmitting path for a transmission signal. That is, the output impedance of the power amplifier is substantially a conjugate complex of the input impedance of the combination circuit, or the frequency response curves respectively corresponding to the output impedance and input impedance of the wireless transmission apparatus is smaller than a pre-set energy during a specified frequency band. Such as that, the VSWR of the wireless transmission apparatus can be reduced, and the transmission efficiency of the wireless transmission apparatus can be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A phase compensating apparatus, adapted for a wireless transmission apparatus, and coupled between an output end of a power amplifier and an input end of an impedance matching apparatus, the phase compensating apparatus, comprising:

a main transmission wire, coupled between the output end of the power amplifier and the input end of the impedance matching apparatus;

two capacitors, having first ends and second ends, the first ends coupled to the main transmission wire; and a phase compensating unit, having two ends directly connected to the second ends of the two capacitors;

wherein a part of the main transmission wire between the first ends of the two of the capacitors being coupled to the phase compensating unit is cut off, and a transmission signal is transmitted through the main transmission wire, the phase compensating unit and the two capacitors.

2. The phase compensating apparatus as claimed in claim 1, wherein the phase compensating apparatus adjusts an output impedance of the power amplifier apparatus to substantially equal to a conjugate complex of an input impedance of a combination circuit of the phase compensating apparatus, impedance matching apparatus, and an antenna, wherein the phase compensating apparatus, impedance matching apparatus, and antenna are coupled in series.

3. The phase compensating apparatus as claimed in claim 1, wherein the phase compensating apparatus adjusts frequency response curves respectively corresponding to an output impedance of the wireless transmission apparatus and an input impedance of wireless transmission apparatus to be smaller than a pre-set energy during a specified frequency band.

4. The phase compensating apparatus as claimed in claim 1, wherein a total effective length of the selected phase compensating unit is less than a wave length of the transmission signal dividing by 2.

5. The phase compensating apparatus as claimed in claim 1, wherein when the phase compensating unit is unselected, the capacitors being coupled to the phase compensating unit are removed, and the unselected phase compensating unit is isolated from the main transmission wire.

6. The phase compensating apparatus as claimed in claim 1, wherein the main transmission wire and the phase compensating unit are formed by a dielectric material.

7. The phase compensating apparatus as claimed in claim 1, wherein a shape of the phase compensating unit is rectangular, triangle or curve.

8. A wireless transmission apparatus, comprising:
- a power amplifier, having an input end for receiving a signal, and an output for generating a transmission signal;
- an antenna;
- an impedance matching apparatus, having an output end for being coupled to the antenna; and
- a phase compensating apparatus, coupled between the output end of a power amplifier and an input end of an impedance matching apparatus, wherein the phase compensating apparatus comprises:
  - a main transmission wire, coupled between the output end of the power amplifier and the input end of the impedance matching apparatus;
  - two capacitors, having first ends and second ends, the first ends coupled to the main transmission wire; and
  - a phase compensating unit, having two ends directly connected to the second ends of the two capacitors;
  - wherein a part of the main transmission wire between the first ends of the two of the capacitors being coupled to the phase compensating unit is cut off and the transmission signal is transmitted through the main transmission wire, the phase compensating unit and the two capacitors.

9. The wireless transmission apparatus as claimed in claim 8, wherein the phase compensating apparatus adjusts an output impedance of the power amplifier to substantially equal to a conjugate complex of an input impedance of a combination circuit of the phase compensating apparatus, impedance matching apparatus, and antenna.

10. The wireless transmission apparatus as claimed in claim 8, wherein the phase compensating apparatus adjusts frequency response curves respectively corresponding to an output impedance of the wireless transmission apparatus and an input impedance of the wireless transmission apparatus to be smaller than a pre-set energy during a specified frequency band.

11. The wireless transmission apparatus as claimed in claim 8, wherein a total effective length of the selected phase compensating unit is less than a wave length of the transmission signal dividing by 2.

12. The wireless transmission apparatus as claimed in claim 8, wherein when the phase compensating unit is unselected, the capacitors being coupled to the phase compensating unit are removed, and the unselected phase compensating unit is isolated from the main transmission wire.

13. The wireless transmission apparatus as claimed in claim 8, wherein the main transmission wire and the phase compensating unit are formed by a dielectric material.

14. The wireless transmission apparatus as claimed in claim 8, wherein a shape of the phase compensating unit is rectangular, triangle or curve.

* * * * *